United States Patent [19]

Chinen

[11] Patent Number: 5,271,030
[45] Date of Patent: Dec. 14, 1993

[54] DISTRIBUTED FEEDBACK SEMICONDUCTOR LASER

[75] Inventor: Koyu Chinen, Yokohama, Japan

[73] Assignee: Kabushiki Kaisha Toshiba, Kawasaki, Japan

[21] Appl. No.: 769,707

[22] Filed: Oct. 2, 1991

[30] Foreign Application Priority Data

Oct. 3, 1990 [JP] Japan .................. 2-267078

[51] Int. Cl.$^5$ .............................. H01S 3/08
[52] U.S. Cl. .............................. 372/96
[58] Field of Search ............ 372/96, 43, 44, 45, 372/50

[56] References Cited

U.S. PATENT DOCUMENTS

| | | | |
|---|---|---|---|
| 4,775,980 | 10/1988 | Chinone et al. | |
| 4,786,132 | 11/1988 | Gordon | |
| 4,885,753 | 12/1989 | Okai et al. | 372/96 |
| 5,070,509 | 12/1991 | Meyers | 372/96 |
| 5,091,916 | 2/1992 | Cimini et al. | 372/96 |

FOREIGN PATENT DOCUMENTS

3-48481  3/1991  Japan .

OTHER PUBLICATIONS

Koch et al., "Semiconductor Lasers for Coherent Optical Fiber Communications," Journal of Lightwave Technology, vol. 8, No. 3, Mar. 1990, pp. 274–293.

Utaka et al., "Effect of Mirror Facets on Lasing Characteristics of Distributed Feedback InGaAsP/InP Laser Diodes at 1.5 µm Range," IEEE Journal of Quantum Electronics, vol. QE-20, No. 3, Mar. 1984.

Yano et al., "Extremely Low-Noise Facet-Reflectivity-Controlled InGaAsP Distributed-Feedback Lasers," Journal of Lightwave Technology vol. LT-4, No. 10, Oct. 1986, pp. 1454–1459.

Wu et al., "Wavelngth tuning and switching of a coupled distributed feedback and Fabry-Perot cavity laser," Journal of Applid Physics, Jan. 15, 1988, pp. 291–294.

A. P. Mozer et al., "Herstellung und Eigenschaften von 1,3 Mum-Dauerstrich-Single-Mode-Lasern", Archiv Fur Elektronik & Ubertragungstechnik, vol. 41, No. 1, Jan./Feb. 1987, pp. 1–9.

Patent Abstracts of Japan, vol. 15, No. 379 (E-1115), Sep. 25, 1991.

Patent Abstracts of Japan, vol. 11, No. 108 (E-495) (2555) Apr. 4, 1987.

Patent Abstracts of Japan, vol. 014550, (E1009) Dec. 6, 1990.

Primary Examiner—Rodney B. Bovernick
Assistant Examiner—Robert E. Wise
Attorney, Agent, or Firm—Finnegan, Henderson, Farabow, Garrett & Dunner

[57] ABSTRACT

A distributed feedback semiconductor laser includes a diffraction grating having a plurality of different pitches. Although it is a multi mode laser, an oscillating mode having a longitudinal single mode characteristic is obtained. The distributed feedback semiconductor laser is thus free from nonlinear characteristics but has low-noise characteristics.

3 Claims, 6 Drawing Sheets

$$\Delta\lambda m = \frac{\lambda^2}{2n_r L}$$

DISTRIBUTED FEEDBACK SEMICONDUCTOR LASER

BACKGROUND OF THE INVENTION

1. Field of the Invention

The present invention relates to a distributed feedback semiconductor laser used for optical fiber communications or the like.

2. Description of the Related Art

As is well-known, in optical fiber communications, an optical signal generated by modulating a light emitting element such as a semiconductor laser is transmitted through an optical fiber. A longitudinal single mode semiconductor laser is used for long-distance transmission in order to prevent the semiconductor laser from being deteriorated by dispersion of the optical signal in the optical fiber. A longitudinal single mode semiconductor laser having good low-noise characteristics is used in an analog multichannel image transmission such as cable television.

The longitudinal single mode semiconductor laser is embodied by a distributed feedback (referred to as DFB hereinafter) semiconductor laser. As shown in FIG. 1, the DFB semiconductor laser comprises a diffraction grating 22 formed on a semiconductor substrate 21, a wave guide layer 23, an active layer 24, a clad layer 25, and a contact layer 26. A bias current If is supplied to electrodes 27 and 28 between which the substrate 21, grating 22, and layers 23-26 are interposed, to inject the current into the active layer 24. The active layer 24 is thus oscillated and, as shown in FIG. 2, a single wavelength λ, which depends upon a pitch P of the diffraction grating 22, and composition and dimension of the wave guide layer 23 and active layer 24, can be obtained.

According to the DFB semiconductor laser having the above structure, photons and electrons in the wave guide layer 23 and active layer 24 interact with each other only in the single wavelength mode. Therefore, the distribution of an internal electric field is strongly influenced by conditions such as pitch P of the diffraction grating 22, refractive index of the wave guide layer 23, and dimension and precision of the active layer 24 and wave guide layer 23. If the conditions are not optimal, an extremely nonlinear output (kink) characteristic or a multi-wavelength oscillation appears in accordance with the density of the injected current. In FIG. 3, samples #1 and #4 show normal characteristics, but samples #2 and #3 show kink characteristics. As a result, there occurs problems of decrease in yield and reliability. Although the longitudinal single mode semiconductor laser having the low-noise characteristic and the low-distortion characteristic is the most suitable for the analog multichannel video transmission, it has the problem of kink characteristic.

FIG. 4 is a cross sectional view showing a structure of a Fabry-Perot (referred to as FP hereinafter) semiconductor laser. As shown in FIG. 4, an active layer 34, a clad layer 35, and a contact layer 36 are formed in sequence on a substrate 31, and these layers substrate are interposed between electrodes 37 and 38. Mirror reflecting surfaces 39a and 39b are formed on both facets of the FP semiconductor laser. Reference character L denotes length of the resonator. FIG. 5 shows power spectrum of the FP semiconductor laser. Since the FP semiconductor laser has no diffraction grating and photons and electrons interact with each other in a plurality of modes, the FP semiconductor laser is excellent in the linearity in light emitting characteristic and thus suitable for analog modulation. However, the interaction of electrons and photons in a plurality of modes causes mode partition noises, and the relative intensity of noise (RIN) of the FP semiconductor laser is greater than that of the longitudinal single mode semiconductor laser by about 20 dB. Thus FP semiconductor laser cannot be used in analog applications.

As described above, in the conventional longitudinal single mode semiconductor laser having low-noise characteristic and low-distortion characteristic, photons and electrons in the active layer and wave guide layer interact with each other only in the single wavelength mode, so that the distribution of the internal electric field is strongly influenced by the pitch of diffraction grating and the dimension and precision of the active layer and wave guide layer.

SUMMARY OF THE INVENTION

It is accordingly an object of the present invention to provide a highly reliable DFB semiconductor laser which has low-noise and low-distortion characteristics and, which can prevent a multi-wavelengths oscillation from being generated.

According to an aspect of the present invention, there is provided a DFB semiconductor laser, comprising an active layer formed on a semiconductor substrate, and a wave guide layer having a band gap larger than that of the active layer and having a diffraction grating formed in parallel with the active layer, the diffraction grating having a plurality of different pitches, being formed in a direction of guided waves, and having a plurality of oscillation wavelengths within a region having a predetermined length.

According to another aspect of the present invention, there is provided a DFB semiconductor laser, comprising an active layer formed on a semiconductor substrate, and a wave guide layer having a band gap larger than that of the active layer and having a diffraction grating formed in parallel with the active layer, a pitch of the diffraction grating being expressed as follows:

$$\Lambda m = \frac{\lambda(2n_r L \pm m\lambda)}{4n_r^2 L}$$

where
  $\Lambda m$ : pitch of diffraction grating
  $n_r$ : effective refractive index of wave guide layer.
  L : length of resonator (cavity length)
  m : positive integer
  λ : oscillation wavelength, and the diffraction grating having a region having a predetermined length and being formed in a direction of guided waves.

According to still another aspect of the present invention, there is provided a DFB semiconductor laser, comprising an active layer formed on a semiconductor substrate, and a wave guide layer having a band gap larger than that of the active layer and having a diffraction grating formed in parallel with the active layer, the diffraction grating having a plurality of different pitches and being formed in a direction of guided waves so as to generate a plurality of oscillation wavelengths having a wavelength interval which is same as a wavelength interval $\Lambda\lambda m$ of a FP mode.

According to the present invention, the diffraction grating having a plurality of different pitches is formed to control the number of oscillating wavelength modes, reduce mode distribution noises, and improve nonlinear outputs.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Embodiments of the present invention will be described with reference to the accompanying drawings.

Figure 1:
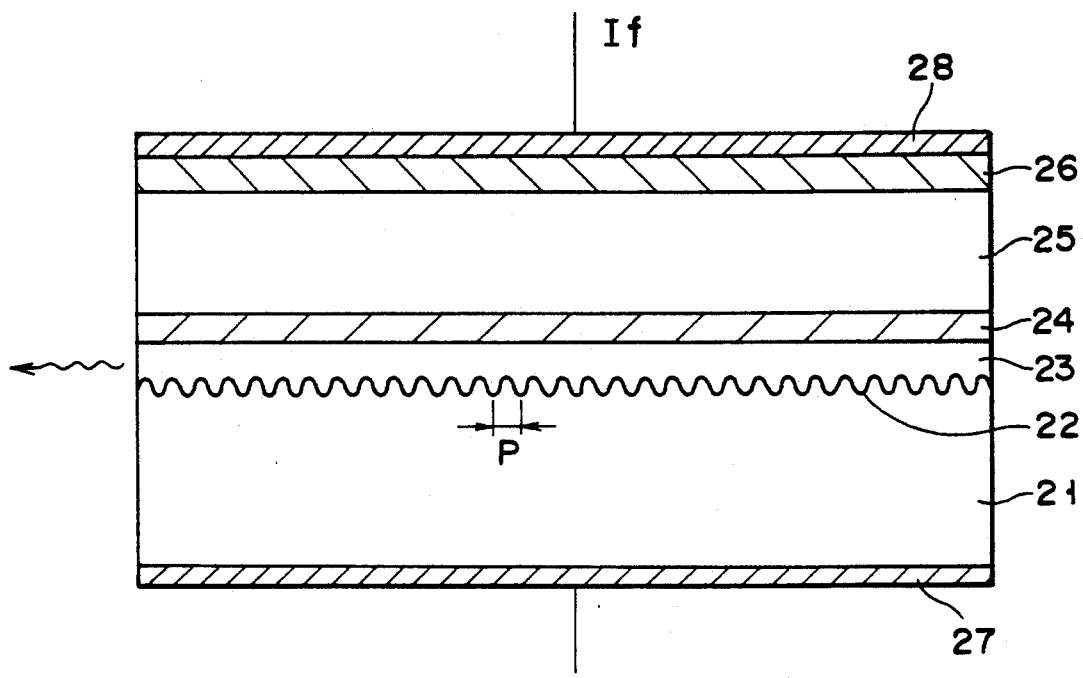
FIG. 1 is a cross sectional view showing a structure of a conventional DFB semiconductor laser.
Figure 2:
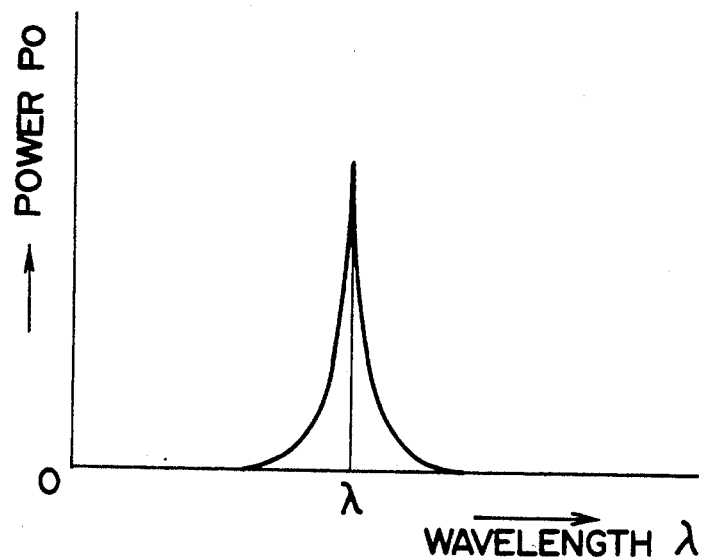
FIG. 2 is a view showing the oscillation wavelength of the semiconductor laser shown in FIG. 1.
Figure 3:
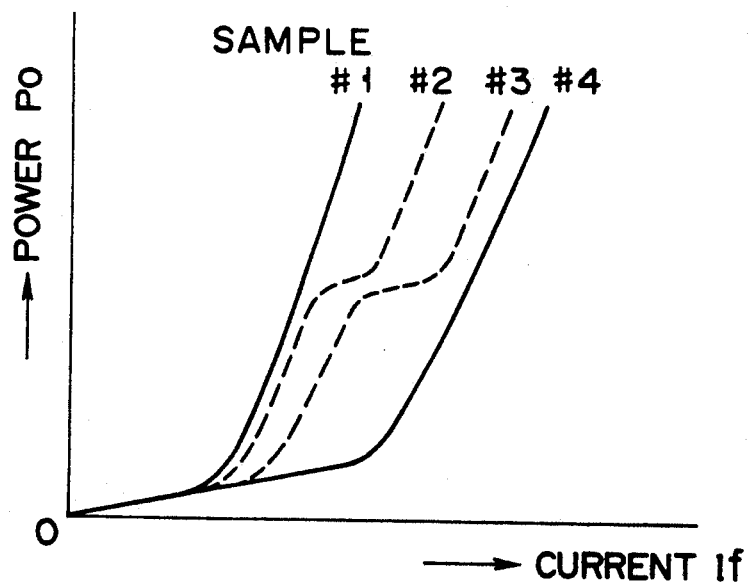
FIG. 3 is a view for explaining the input current vs. output power characteristic of the semiconductor laser shown in FIG. 1.
Figure 4:
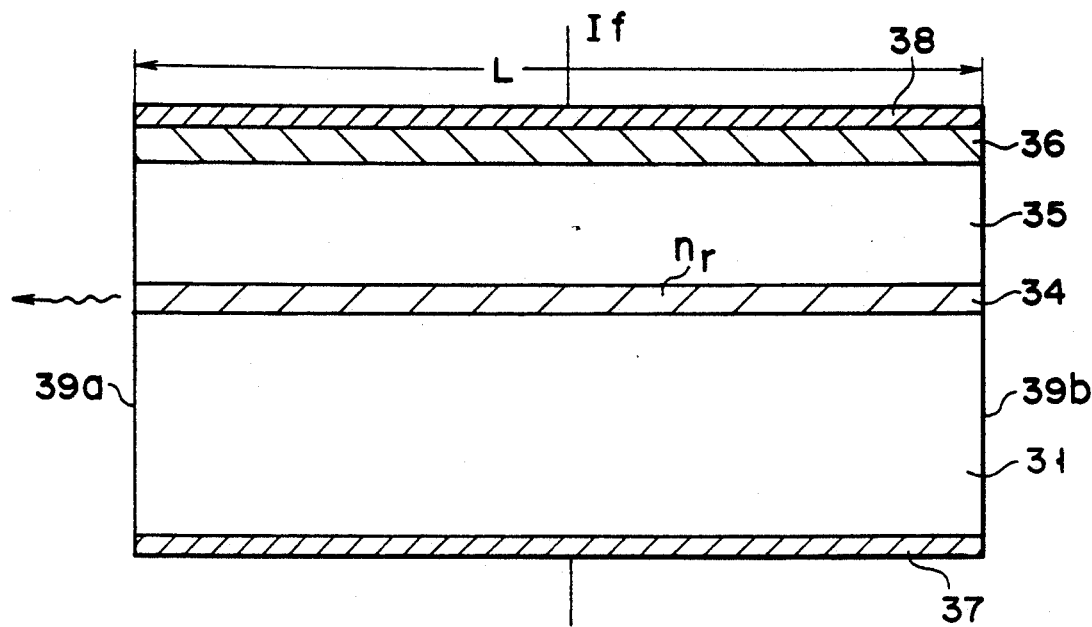
FIG. 4 is a cross sectional view showing a structure of a FP semiconductor laser.
Figure 5:
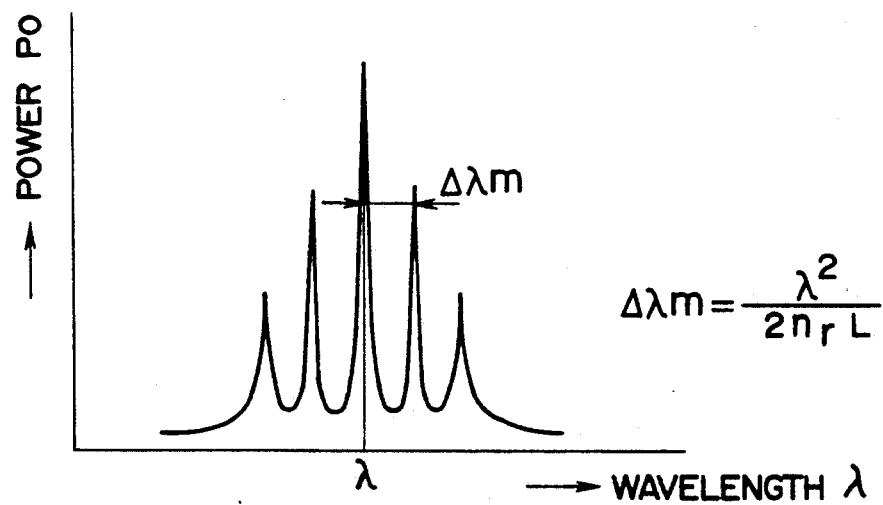
FIG. 5 is a view showing the oscillation wavelength of the laser shown in FIG. 4.
Figure 6:
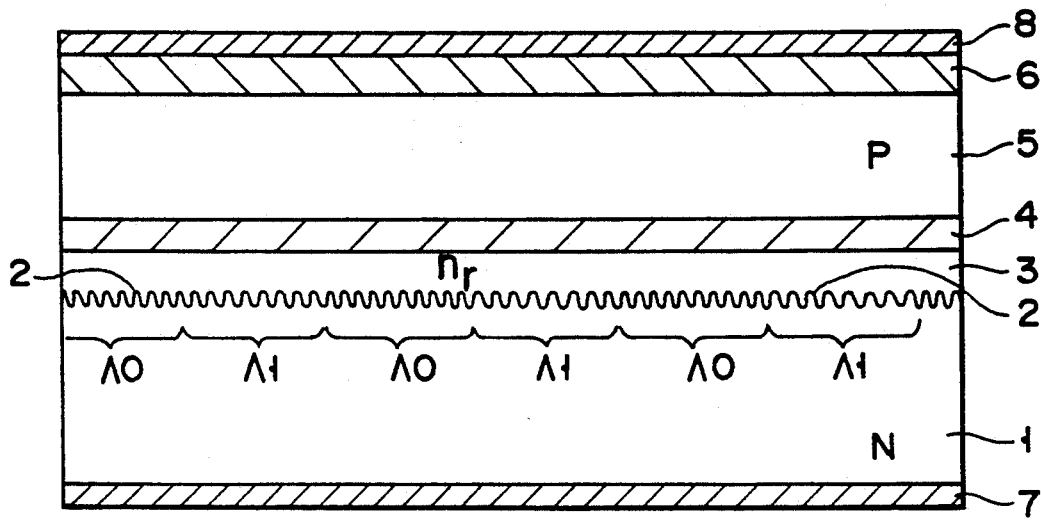
FIG. 6 is a cross sectional view showing a structure of a laser according to an embodiment of the present invention.

FIG. 6 is a cross sectional view showing a structure of a DFB semiconductor laser according to an embodiment of the present invention. A diffraction grating 2 having pitches different from each other by predetermined lengths is formed on an N-type semiconductor substrate 1 which is doped with InP. A wave guide layer 3 doped with InGaAsP, an active layer 4, a P-type clad layer 5 doped with InP, and a P+-type contact layer 6 doped with InGaAsP are formed in sequence on the diffraction grating 2. An electrode 7 is formed on the underside of the substrate 1, and an electrode 8 is formed on the contact layer 6. The pitches of the diffraction grating 2 have different values from the central value, as represented by the following equation.

$$\Lambda = \lambda/2n_r \qquad \ldots (1)$$

where $\Lambda$: pitch of diffraction grating $\lambda$: wavelength $n_r$: effective refractive index of wave guide layer 3.

If $n_r = 3.7$ is used when the oscillation wavelength of the semiconductor laser is in 1.3 μm band, then, according to the equation (1), the predetermined pitch length $\Lambda_0 = 1770$Å. In the embodiment shown in FIG. 6, the diffraction grating having the pitch $\Lambda_1 = 1771.6$Å and the diffraction grating having the pitch $\Lambda_0$ are alternately arranged 50 μm by 50 μm.

Figure 7:
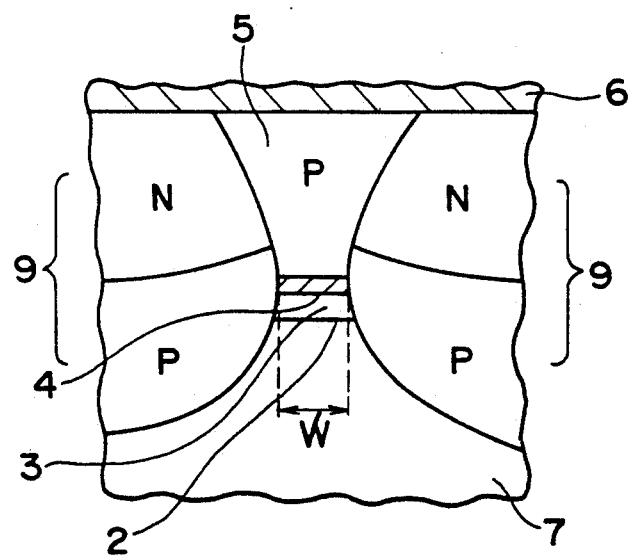
FIG. 7 is an end view showing a light emitting facet of the semiconductor laser shown in FIG. 6.

FIG. 7 is an end view showing a light emitting facet of the semiconductor laser shown in FIG. 6. The width W of the active layer 4 and the wave guide layer 3 is about 1 μm to obtain a lateral single mode. Both sides of the active layer 4 and the wave guide layer 3 are optically and electrically blocked by an N-P type reverse junction blocking layer 9 of InP.

Figure 8:
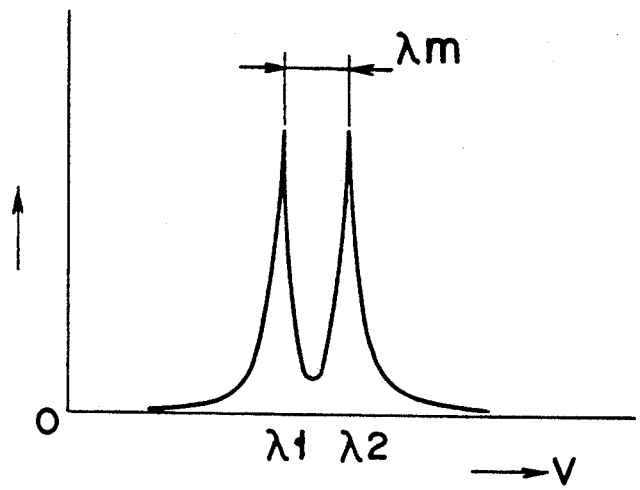
FIG. 8 is a view showing the oscillation wavelength of the semiconductor laser shown in FIG. 6.
Figure 9:
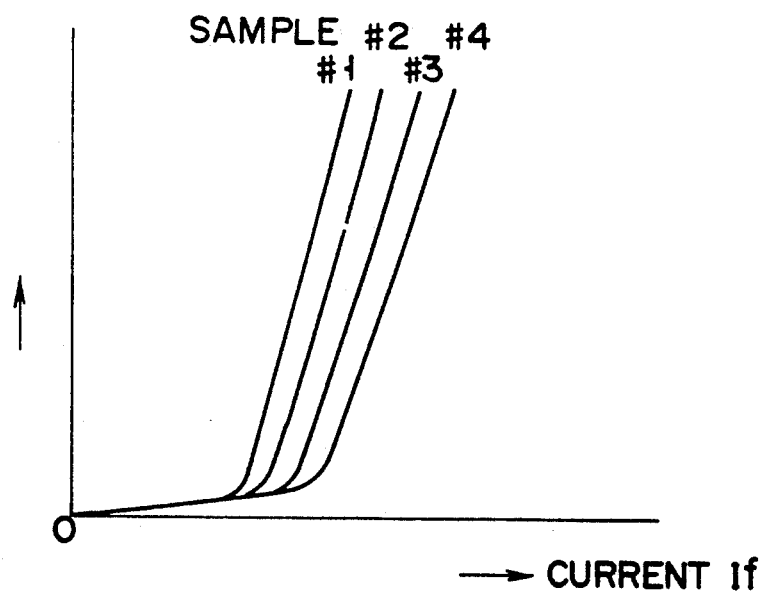
FIG. 9 is a view for explaining the input current vs. power characteristic of the semiconductor laser shown in FIG. 6.

As shown in FIG. 8, the DFB semiconductor laser having the above structure has two wavelengths $\lambda_1$ (1310 nm) and $\lambda_2$ (1311 nm), and the side mode suppression ratio of two oscillation modes is 35 dB or more. Since the interactions between photons and electrons are distributed into two modes, the nonlinear output characteristic of the DFB semiconductor laser is greatly improved, resulting in improvement in yield, as is apparent from samples #1 to #4 shown in FIG. 9. This can be done even though the pitch of the diffraction grating, and the dimensions of the active layer and wave guide layer do not meet the optimum conditions. Even if the suppression ratio is 30 dB, the dispersion of optical signals in long-distance transmission is hardly affected adversely since a wavelength interval between the two oscillation modes is 1 nm.

In the above embodiment, the pitch of diffraction grating is 1.3 μm; however, the same effect can be obtained even if it is 1.55 μm. In this case, a buffer layer can be formed on the active layer 4 when the need arises. The diffraction grating 2 can also be formed on the active layer 4. In the above embodiment, the diffraction grating 2 is formed so that its two pitches are alternately changed 50 μm by 50 μm. However, the present invention is not limited to 50 μm pitch and the pitches can be changed at an equal rate, at an inequable rate, or in arbitrary order. The number of pitches of the diffraction grating is not limited to two but can be three or more.

A DFB semiconductor laser according to another embodiment of the present invention will be described with reference to FIG. 6.

A low-noise multi mode semiconductor laser is ideal for the analog multichannel image transmission from the viewpoint of a tolerance for return light. When a high reflectance film is deposited on the facets of the DFB semiconductor laser to obtain an output of a high output, the DFB semiconductor laser include a Fabry-Perot mode output. In the DFB semiconductor laser, therefore, it is only necessary to arrange a plurality of pitches of a diffraction grating which causes a plurality of oscillation wavelengths (see FIG. 8) having the same wavelength interval as $\Delta\lambda m$ of the Fabry-Perot mode. The wavelength interval $\Delta\lambda m$ of the Fabry-Perot mode is expressed by the following equation.

$$\Delta\lambda m = \lambda^2/2n_r L \qquad \ldots (2)$$

where $\Delta\lambda m$: wavelength interval $n_r$: effective refractive index of wave guide layer $\lambda$: wavelength L : length of resonator (cavity length)

The pitch $\Lambda m$ of diffraction grating is given by the following equation.

$$\Lambda m = \frac{\lambda \pm m\Delta\lambda m}{2n_r} \quad (3)$$

Substituting the equation (2) for the equation (3), the pitch $\Lambda m$ is expressed by the following equation.

$$\Lambda m = \frac{\lambda(2n_r L \pm m\lambda)}{4n_r^2 L} \quad (4)$$

(m is an integer)

A diffraction grating having three kinds of pitches is formed under the condition that the central pitch is $\Lambda_0$ and m=1. The diffraction grating is formed with the pitch $\Lambda_0$ between pitches $\Lambda_1$. If the wavelength $\lambda$ is 1310 nm, the pitches of the diffraction grating are $\Lambda_0 = 1770$Å, and $\Lambda_1 = 1771.3$Å and 1769.2Å.

Figure 10A:
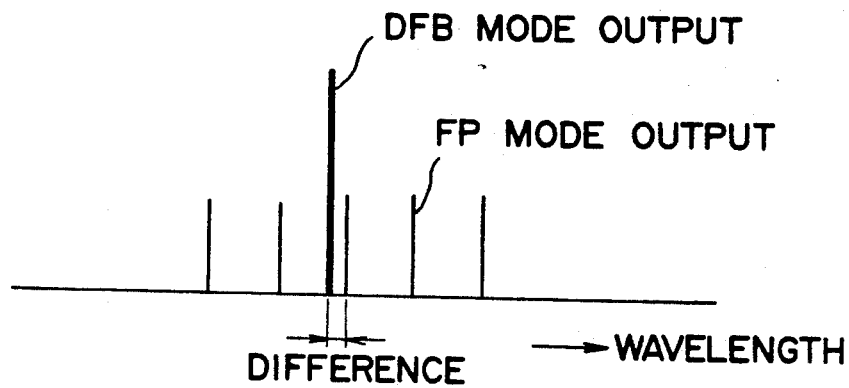
FIG. 10A is a view showing the phase of a conventional FP mod DFB semiconductor later.
Figure 10B:
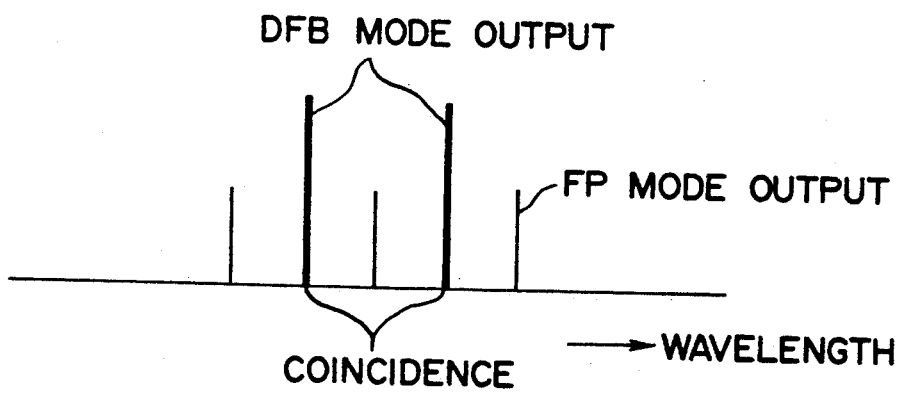
FIG. 10B is a view showing the phase of a FP mode of the semiconductor laser of the present invention.

Since the DFB semiconductor laser having the above-described structure has three oscillation modes, the DFB mode coincides with the FP mode having three or four main oscillation modes. FIG. 10A shows a phase difference between an output of the DFB mode and that of the FP mode, and FIG. 10B shows a phase coincidence between them. The DFB laser is not therefore influenced by a variation in phase due to the reflection of wave on the facet of a resonator. Since the photons and electrons interact with each other in three modes, the nonlinear output characteristic such as a kink can hardly be obtained. Further, the mode can hardly be distributed since a gain is specified by the diffraction grating, and a high relative intensity of noise peculiar to the FP semiconductor laser is improved.

In the above embodiment, the wavelength $\lambda$ is 1310 nm. However, it can be set to 1550 nm or the other value. Although three oscillation modes are used in the embodiment, the same effect can be obtained if the number of the modes is two or more. The refractive index of the facet of the resonator can be set at an arbitrary value.

As described above, according to the present invention, since a diffraction grating having different pitches, an oscillation mode having a longitudinal single mode characteristic can be obtained although it is a multi mode. A DFB semiconductor laser having no nonlinear characteristic but low-noise characteristic can thus be provided.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A distributed feedback semiconductor laser comprising:
   an active layer on a semiconductor substrate; and
   a wave guide layer having a band gap larger than that of said active layer and having a diffraction grating along said active layer,
   said diffraction grating having a plurality of different pitches distributed in a direction of guided waves so as to simultaneously generate a plurality of separated oscillation wavelengths.

2. A semiconductor laser as claimed in claim 1 wherein said plurality of separated oscillation wavelengths have a wavelength which is the same as a wavelength interval $\Delta\lambda m$ of a Fabry-Perot mode.

3. A distributed feedback semiconductor laser comprising:
   an active layer on a semiconductor substrate; and
   a wave guide layer having a band gap larger than that of said active layer and having a diffraction grating in parallel with said active layer,
   a pitch of said diffraction grating being expressed as follows:

$$\Lambda m = \frac{\lambda(2n_r L \pm m\lambda)}{4n_r^2 L}$$

where
   $\Lambda m$ : pitch of diffraction grating
   $n_r$ : effective refractive index of wave guide Layer
   L : length of resonator (cavity length)
   m : positive integer
   $\lambda$ : oscillating wavelength,
   and said diffraction grating having a region having a predetermined length and being in a direction of guided waves.

* * * * *